US 7,134,558 B1

(12) United States Patent
Mimlitch, III et al.

(10) Patent No.: US 7,134,558 B1
(45) Date of Patent: Nov. 14, 2006

(54) UNIVERSAL RACK MOUNTABLE SHELF

(75) Inventors: Robert H. Mimlitch, III, Rowlett, TX (US); David Anthony Norman, Greenville, TX (US)

(73) Assignee: Innovation First, Inc., Greenville, TX (US)

( * ) Notice: Subject to any disclaimer, the term of this patent is extended or adjusted under 35 U.S.C. 154(b) by 0 days.

(21) Appl. No.: 10/389,661

(22) Filed: Mar. 14, 2003

Related U.S. Application Data

(60) Provisional application No. 60/365,228, filed on Mar. 14, 2002.

(51) Int. Cl.
*A47F 7/00* (2006.01)
(52) U.S. Cl. .......................... 211/26; 211/189; 211/191
(58) Field of Classification Search .................. 211/26, 211/26.2, 134, 135, 90.01, 86.01, 126.1, 126.15, 211/189–192, 151; 312/223.1, 223.2, 257.1, 312/265.1, 330.1
See application file for complete search history.

(56) References Cited

U.S. PATENT DOCUMENTS

| | | | | |
|---|---|---|---|---|
| 5,340,340 A | * | 8/1994 | Hastings et al. | ............... 439/64 |
| 5,351,176 A | * | 9/1994 | Smith et al. | ................. 361/681 |
| 5,542,549 A | | 8/1996 | Siemon et al. | |
| 5,941,621 A | | 8/1999 | Boulay et al. | |
| 6,021,909 A | * | 2/2000 | Tang et al. | ................... 211/183 |
| 6,170,784 B1 | * | 1/2001 | MacDonald et al. | ........... 248/65 |
| 6,220,456 B1 | | 4/2001 | Jensen et al. | |
| 6,254,041 B1 | * | 7/2001 | Dufourg | ....................... 248/65 |
| 6,349,837 B1 | * | 2/2002 | Serban | ......................... 211/26 |
| 6,370,022 B1 | * | 4/2002 | Hooper et al. | ............... 361/685 |
| 6,431,668 B1 | | 8/2002 | Reddicliffe | |
| 6,644,481 B1 | * | 11/2003 | Dean et al. | .................... 211/26 |
| 6,655,534 B1 | * | 12/2003 | Williams et al. | ............... 211/26 |
| 6,719,149 B1 | * | 4/2004 | Tomino | ........................ 211/26 |
| 2001/0040142 A1 | | 11/2001 | Haney | |
| 2002/0043508 A1 | * | 4/2002 | Lewis | .......................... 211/26 |
| 2003/0019823 A1 | * | 1/2003 | Corbett et al. | ................. 211/26 |

OTHER PUBLICATIONS

Chatsworth Products, Inc., www.chatsworth.com, Dell Rack-Mount Server Solutions, Form No. MKT-60020-061-CH, Dec. 2001.

* cited by examiner

*Primary Examiner*—Jennifer E. Novosad
(74) *Attorney, Agent, or Firm*—Fish & Richardson, P.C.

(57) ABSTRACT

Equipment is supported within a rack system regardless of the design of the rack system using a base of a support that includes a surface capable of supporting the equipment and reducing unintended movement of the equipment. Brackets capable of being securely attached to the rack system, regardless of whether it is two-post or four-post in design, are associated with the base of the support. Equipment can be supported by selecting a design of the rack system, attaching the support of the present system, and placing the equipment to be supported.

23 Claims, 15 Drawing Sheets

STEP 10 – Select a design of rack system to be used with the shelf.

STEP 20 – the front fixed bracket and the rear sliding bracket are coupled to the shelf and the rack system selected in Step 10

STEP 30 – A load (e.g., electrical equipment) is placed upon the shelf

STEP 40 – the shelf may be extended away from its resting position within the rack system selected in Step 10 to facilitate access to the equipment being supported by the shelf

FIGURE 12

UNIVERSAL RACK MOUNTABLE SHELF

CROSS-REFERENCE TO RELATED APPLICATIONS

This application is related to co-pending provisional application Ser. No. 60/365,228, filed Mar. 14, 2002, which is incorporated herein by reference.

TECHNICAL FIELD

The present invention relates to a support rack, and more particularly to an apparatus and method for supporting equipment, such as electronic equipment.

BACKGROUND

The physical support of objects or devices (e.g., electronic equipment) on a horizontal plane presents a number of related issues. For purposes of this application, the term "equipment" shall be used to include, without limitation, computers (of all designs, including desktop and tower), computer components, tape backups, hubs, switches, power supplies, audio/visual components, and the like.

It is generally desirable to support equipment in a manner that facilitates their operation, if applicable. For example, such support should orient the equipment in proper or recommended spatial orientation. Other orientation may be dictated by the function (e.g., placement of cooling fan) or other consideration. Next, support should be accomplished in a manner that consumes the smallest amount of space, but still provides the user with a desired level of access. Such access may be necessary to monitor and/or maintain the equipment being supported. With modern office and storage space at a premium, the development of racks and other stacking devices for such equipment has occurred.

Existing shelf designs are typically made by rack manufacturers and are limited to coupling with the respective manufacturer's two- or four-post rack design, and few, if any, others. Many manufacturers provide two- or four-post racks designed to support equipment, such as servers and the like, for being supported on shelves that are respectively coupled to the two- or four-post rack systems. However, there is a need for a universal rack mountable shelf that is adapted to attach to substantially all two- or four-post rack systems, regardless of manufacturer. In addition, because space is a premium concern for users of two- or four-post rack systems, there is a need for multiple mounting orientations of shelves in the two- or four-post rack system.

SUMMARY

The present invention is an apparatus and method for supporting equipment on a horizontal surface or shelf, which may be secured to a two- or four-post rack having various configurations known in the art. According to the principles of the present invention, a universal rack mountable shelf is designed to mount in substantially all two- and four-post racks, regardless of mounting depth, rack-post style, and manufacturer. The shelf of the present invention may be mounted right-side-up or in a reverse configuration, depending on the requirements of the user.

In general, the principles of the present invention provide for a fixed, rack mountable shelf that couples to a two- or four-post rack and supports electrical equipment such as computer components, servers or the like. The apparatus of the present invention includes a base portion having a support surface adapted to support various types of equipment. Slots or holes may be provided on the support surface to serve several functions. First, the slots or holes reduce the overall weight of the shelf. Second, the slots may be orientated in a right-to-left or left-to-right direction, which increases the front-to-back friction between the shelf and the rubber feet of the equipment supported thereon. The orientation of the slots serves to reduce the likelihood of equipment inadvertently sliding off of the shelf. Third, the slots may be oriented in a front-to-back direction to allow equipment to be coupled to the shelf via straps or other coupling mechanisms. The coupling of equipment to the shelf may be desirable in regions prone to structural shifting and the like.

The details of one or more embodiments of the invention are set forth in the accompanying drawings and the description below. Other features, objects, and advantages of the invention will be apparent from the description and drawings, and from the claims.

DESCRIPTION OF DRAWINGS

The FIGURES outlined below further illustrate the apparatus and method of the present invention. Like reference symbols in the various drawings indicate like elements.

FIG. 12 is a flowchart illustrating the steps of an embodiment of the method of the present invention.

DETAILED DESCRIPTION

Various embodiments of the principles of the present invention are shown in FIGS. 1–12. In general, the principles of the apparatus of the present invention provide for a rack mountable shelf 10 that couples to a two- or four-post rack 20 and supports electronic equipment 25 (shown in FIGS. 11A and 11B), such as a server.

Figure 1:
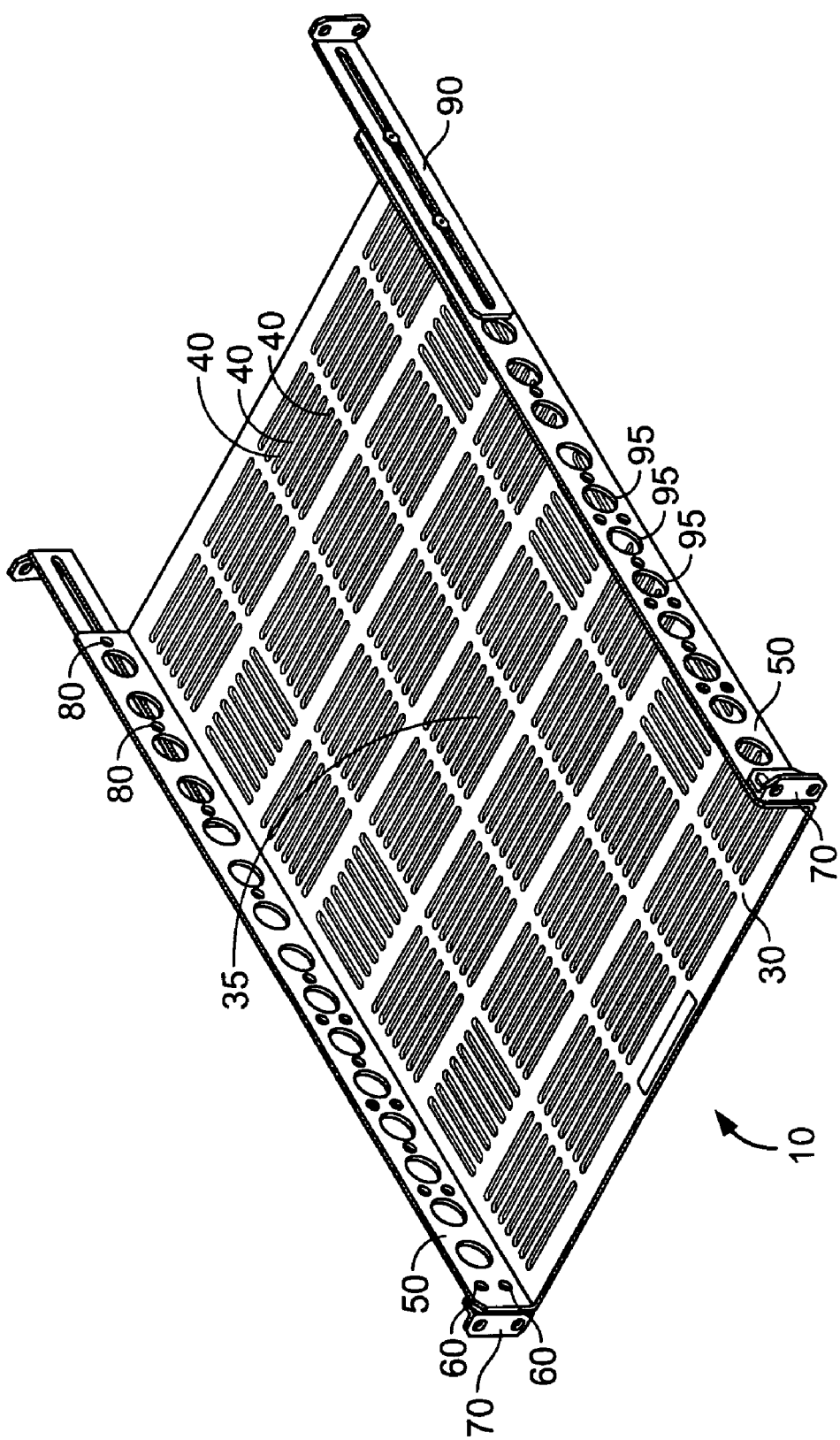
FIG. 1 is a front, angled view of an embodiment of the apparatus of the present invention assembled in a 4-post configuration.
Figure 2:
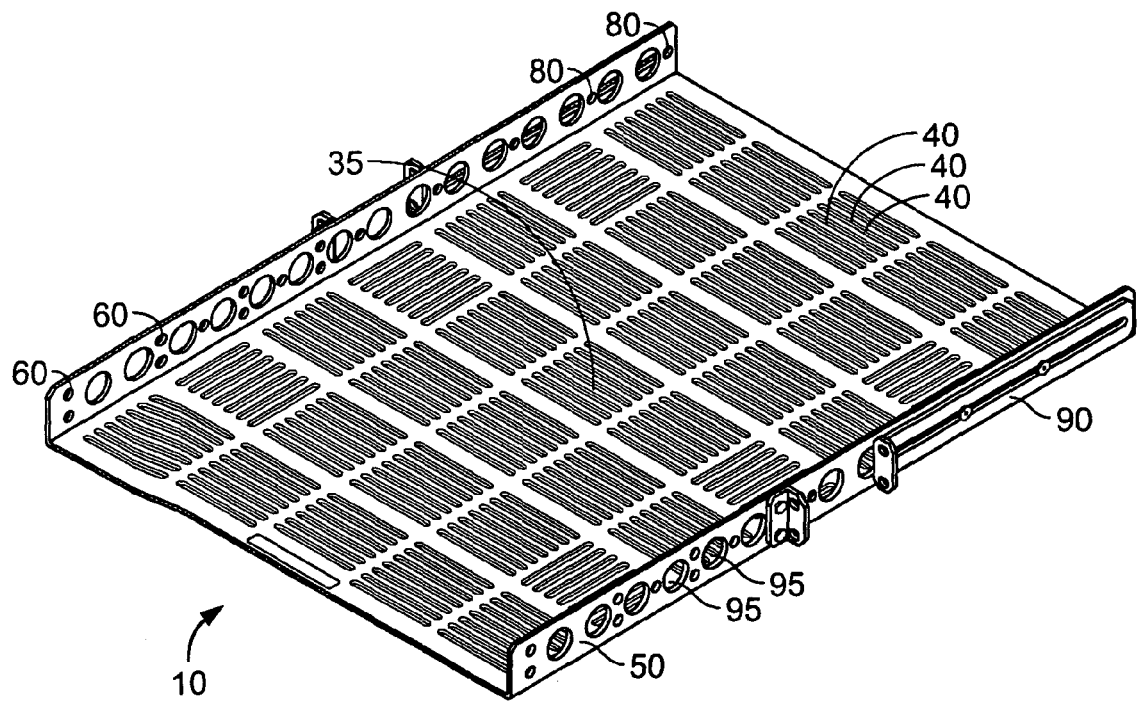
FIG. 2 is a front, angled view of an embodiment of the apparatus of the present invention assembled in a 2-post, center-mount configuration.
Figure 3:
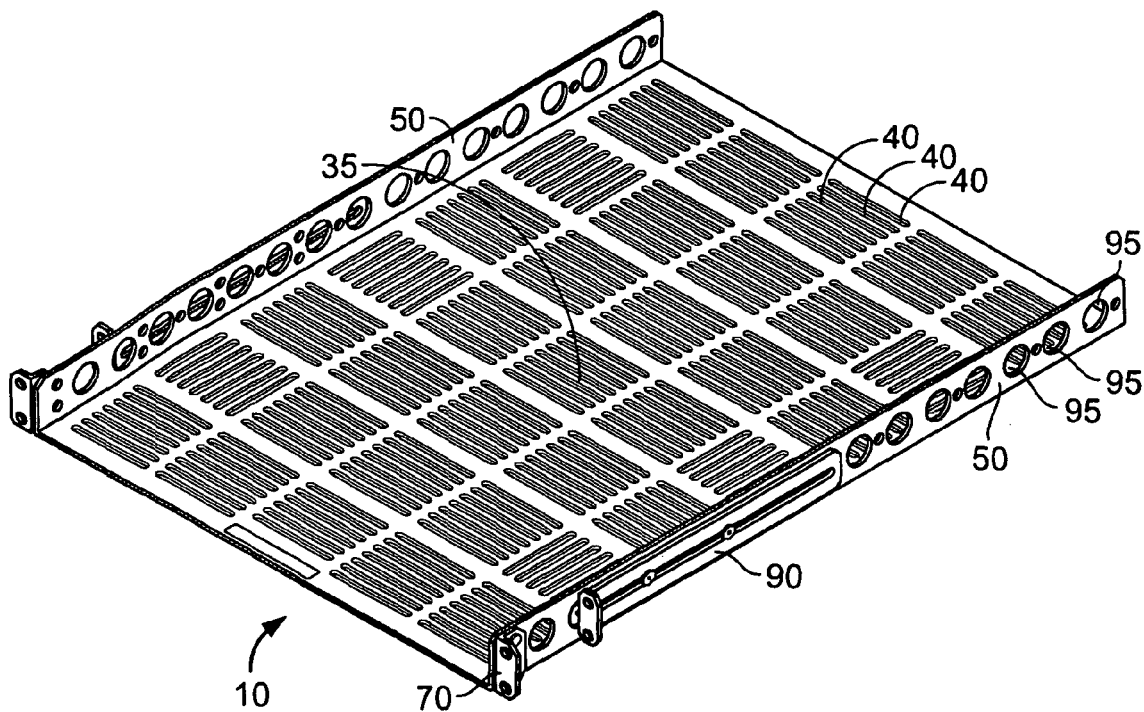
FIG. 3 is a front, angled view of an embodiment of the apparatus of the present invention assembled in a 2-post, flush-mount configuration.
Figure 4A:
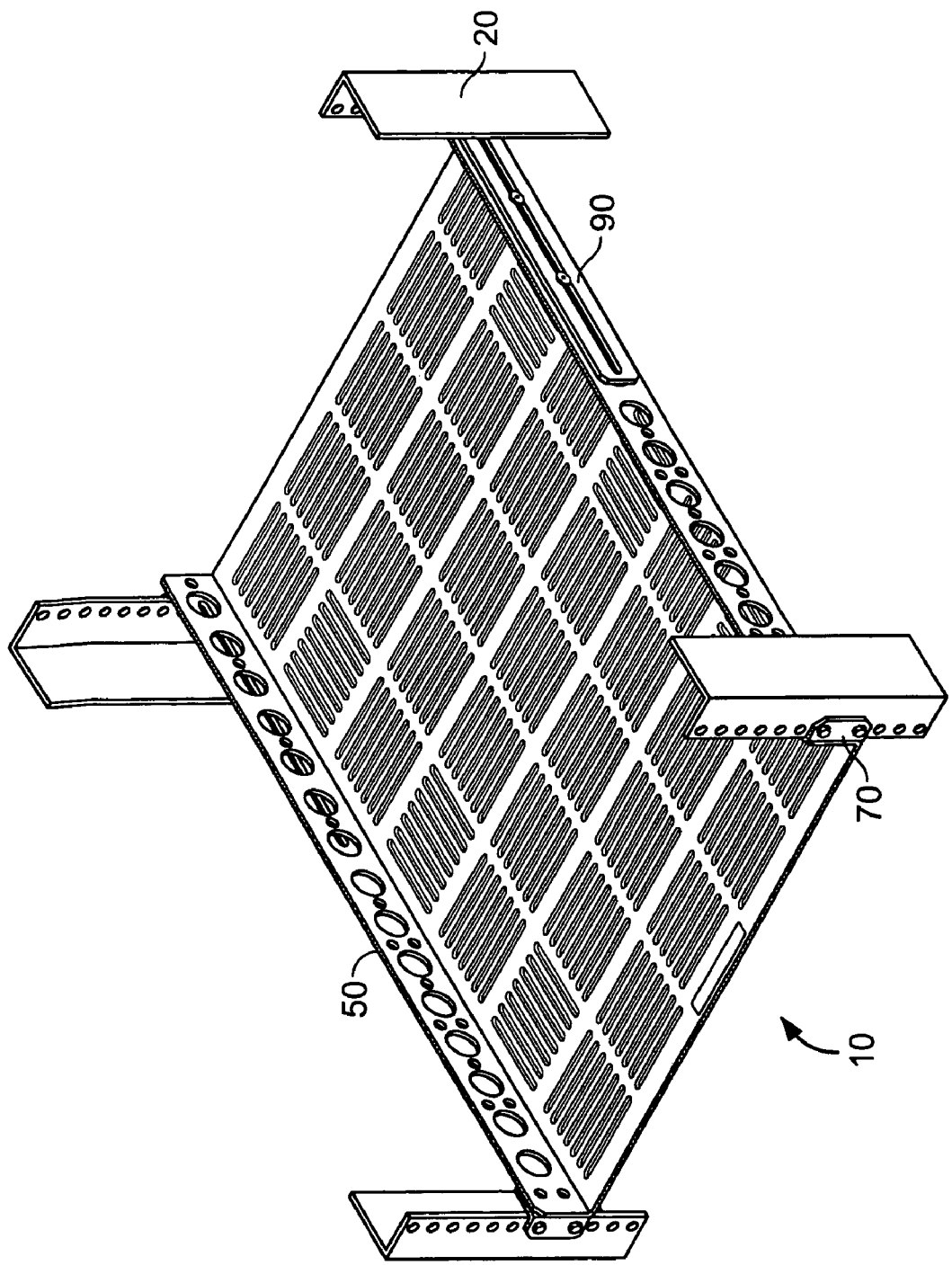
FIG. 4A is a front, angled view of an embodiment of the apparatus of the present invention assembled in a 4-post, shallow rack configuration.
Figure 4B:
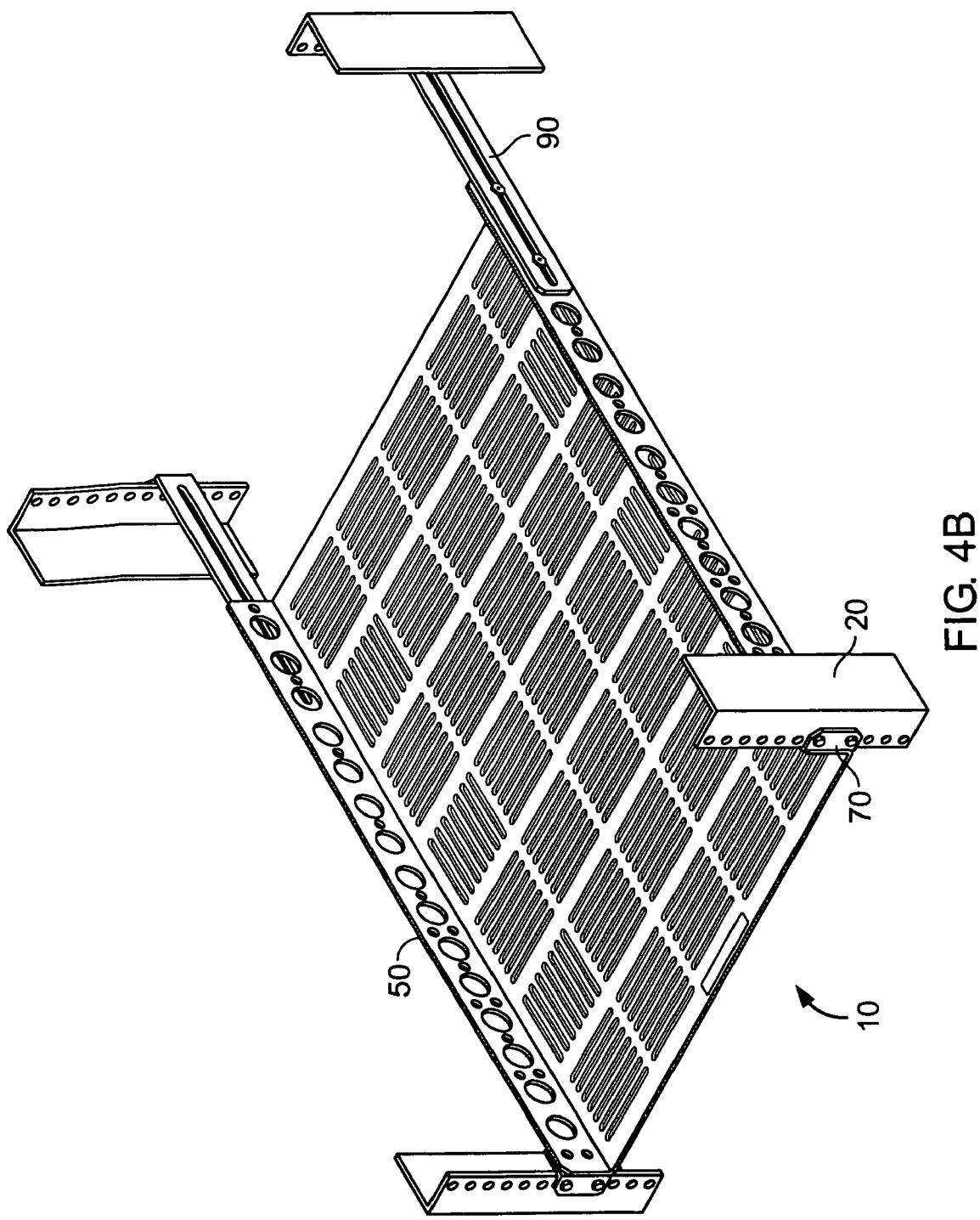
FIG. 4B is a front, angled view of an embodiment of the apparatus of the present invention assembled in a 4-post, deep rack configuration.
Figure 11A:
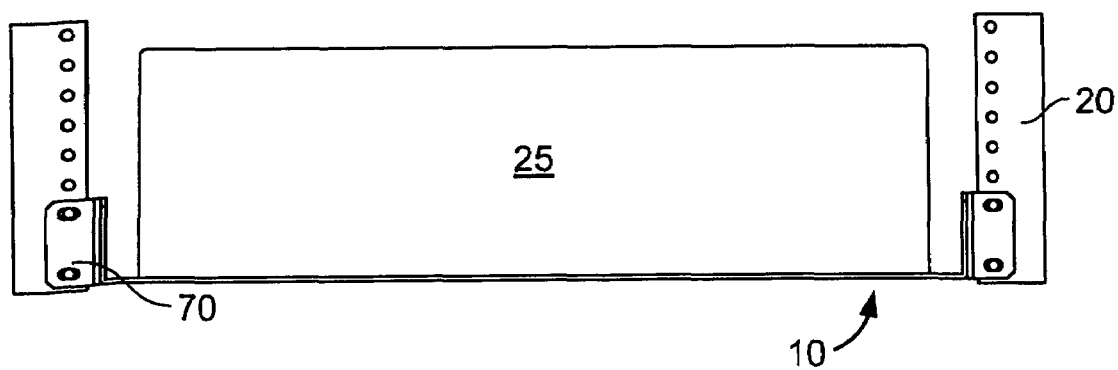
FIG. 11A is a front view of an embodiment of the apparatus of the present invention showing a right-side-up mount orientation to conserve vertical space on the rack.
Figure 11B:
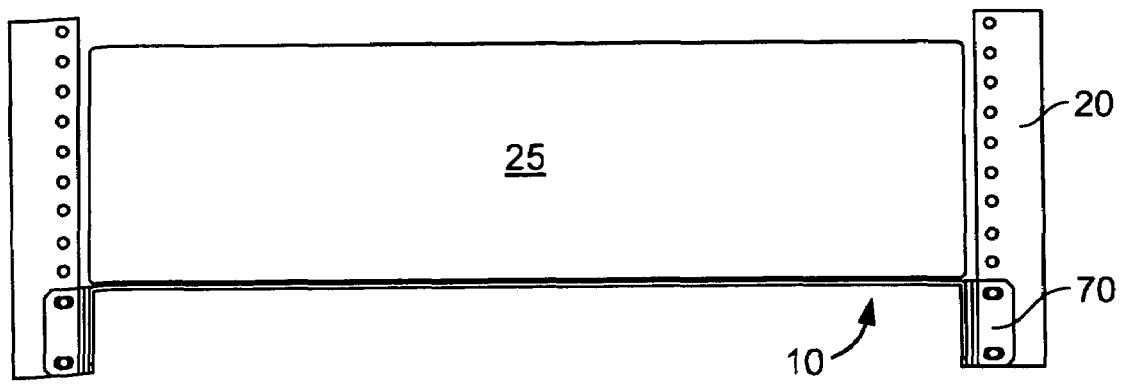
FIG. 11B is a front view of an embodiment of the apparatus of the present invention showing a up-side-down mount orientation to conserve horizontal space on the rack.

Now referring to FIGS. 1–3, the shelf 10 includes a base portion 30 having a surface 35 adapted to support equipment (shown in FIG. 11A and 11B). The surface 35 of the base 30 preferably provides a high-friction or non-slip surface upon which equipment can rest to prevent the unintentional movement of equipment. By way of example, and not limitation, a non-slip surface can be achieved by: (1) providing slots or holes 40 (or any other type or shape of opening) in the surface 35, preferably with alternating orientation; (2) roughening the surface 35 via mechanical means or other means known in the art (e.g., textured paint); (3) covering the surface 35 with a material (e.g., commercially available anti-slip matting or rubber sheet); or (4) some combination thereof. When coupled with use of rubber or similar material feet on the equipment to be supported, the surface 35 substantially reduces the likelihood of unintentional movement of the equipment. It is noted that use of slots or holes (40) also provides other benefits to the operation of the shelf 10. For example, such slots or holes 40 may be oriented in a front-to-back direction to allow equipment to be coupled to the shelf 10 via straps or other coupling mechanisms (not shown). The coupling of equipment to the shelf 10 may be desirable in regions prone to structural shifting and the like. Additionally, use of slots or holes 40 operate to reduce the overall weight of the shelf 10.

Preferably, the shelf 10 is composed of a durable, relatively lightweight material, such as aluminum or the like metal, but can be composed of any suitable material or combination of materials desired. For heavier equipment to be supported, steel or other heavier construction materials may be employed.

Two flanges 50 are provided on opposing ends of the base 30. The flanges 50 may have a plurality of front fixed bracket mounting holes 60 proximal a front portion for coupling a front fixed bracket 70 thereto. The plurality of front fixed bracket mounting holes 60 may, in some embodiments, be aligned vertically or in any other desired configuration. The number and location of the front fixed bracket mounting holes 60 may be adjusted depending on the rack depth and the requirements of the user. A plurality of rear sliding bracket mounting holes 80 may also be provided on the flanges 50 for coupling a rear sliding bracket 90 thereto. The number and location of rear sliding bracket mounting holes 80 may be adjusted depending on the rack depth and the requirements of the user. The rear sliding mounting holes 80 may, in certain embodiments, be aligned horizontally or in any other desired configuration. A plurality of openings 95 may be provided on the flanges 50 to allow wires to pass therethrough for guiding and coupling, and to reduce the weight of the shelf 10. A location 97 (FIG. 6) on the shelf 10 may be provided for indicia (e.g., labeling), depending on the requirements and/or desires of the user.

Figure 7:
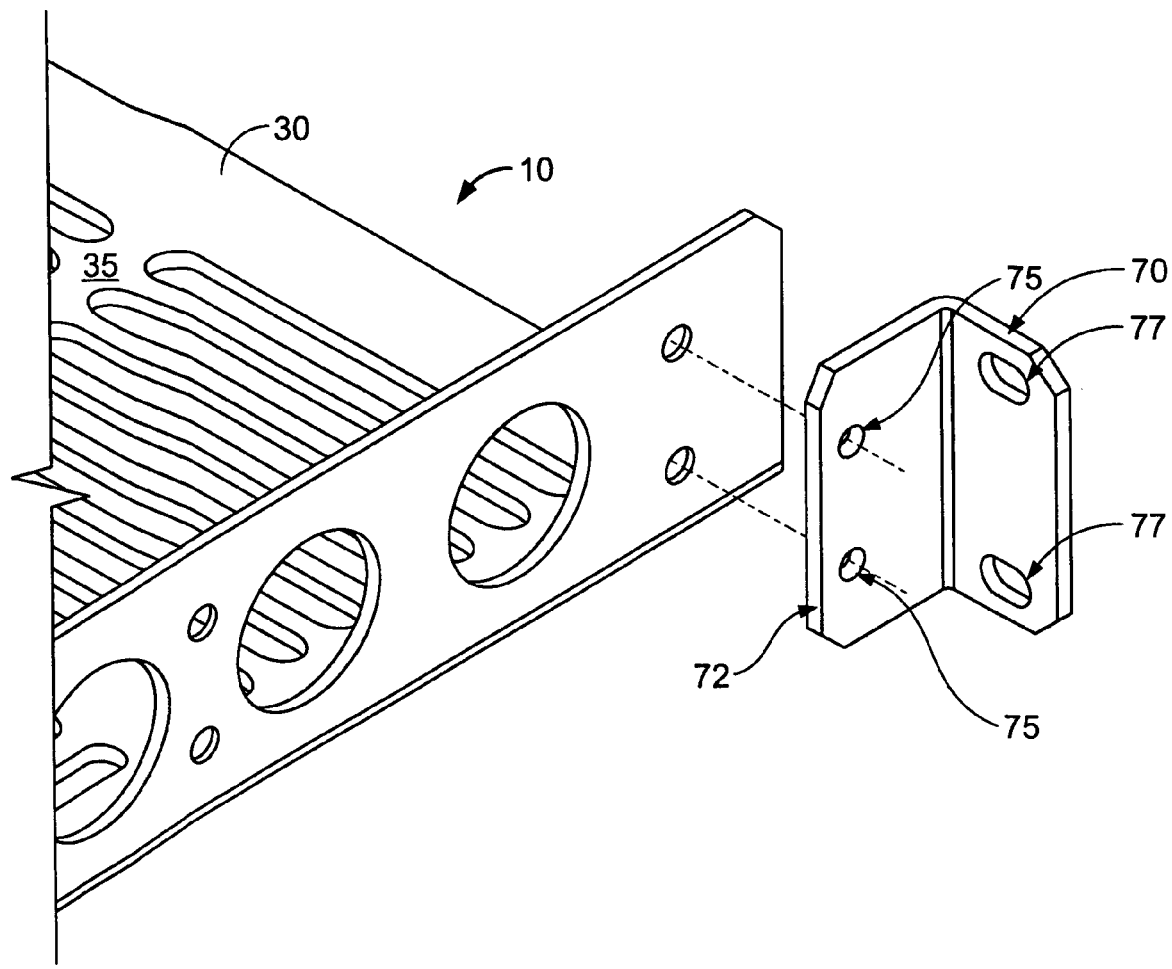
FIG. 7 is an exploded view of an embodiment of the apparatus of the present invention showing a front bracket attachment.

Now referring to FIG. 7, the front fixed bracket 70 serves as a structural attachment between the shelf 10 and the front rack attachment flange (not shown). The front fixed bracket 70 has a plurality of shelf-mating holes 75 on a shelf attach flange 72 for coupling the front fixed bracket 70 to the shelf 10. Fasteners, such as screws and the like, may be used to couple the front fixed bracket 70 to the shelf 10 through the shelf-mating holes 75. Rack mounting holes 77 are provided on the rack attach flange of the front fixed bracket for coupling to a rack 20. The rack mounting holes 77 are preferably located per EIA-310-D. The front fixed bracket 70 is preferably used on both sides of the shelf 10, and may be coupled to the shelf 10 in the configurations shown and described in FIGS. 1–11B.

Figure 8:
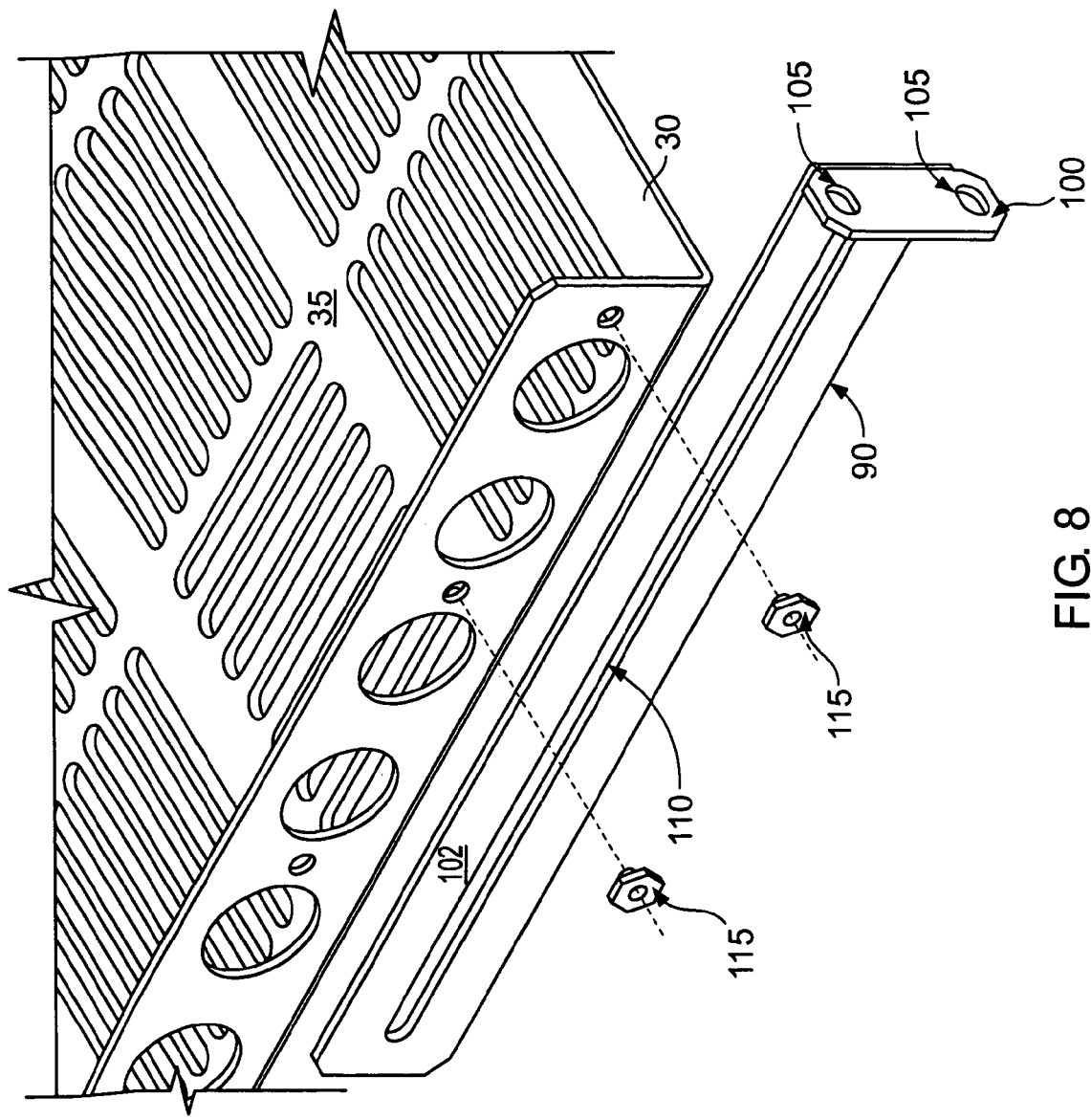
FIG. 8 is an exploded view of an embodiment of the apparatus of the present invention showing a front sliding bracket attachment.
Figure 9A:
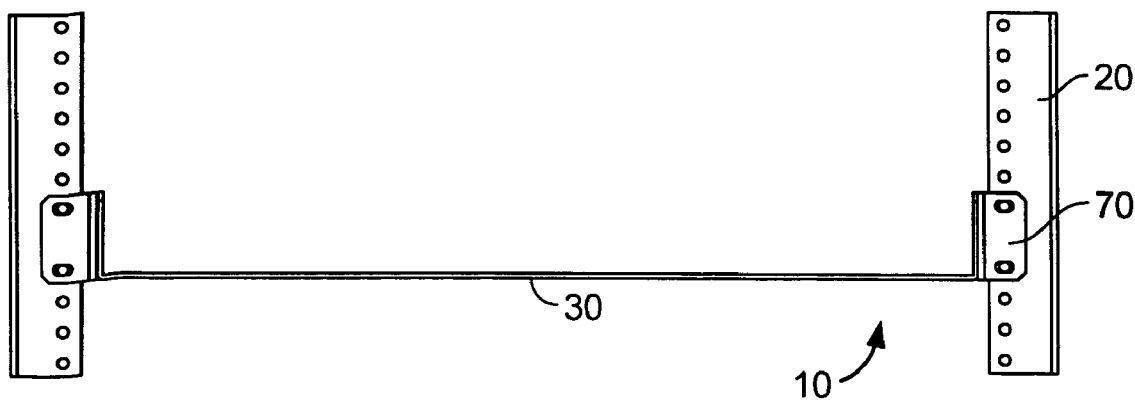
FIG. 9A is a front view of an embodiment of the apparatus of the present invention showing a right-side-up mount.
Figure 9B:
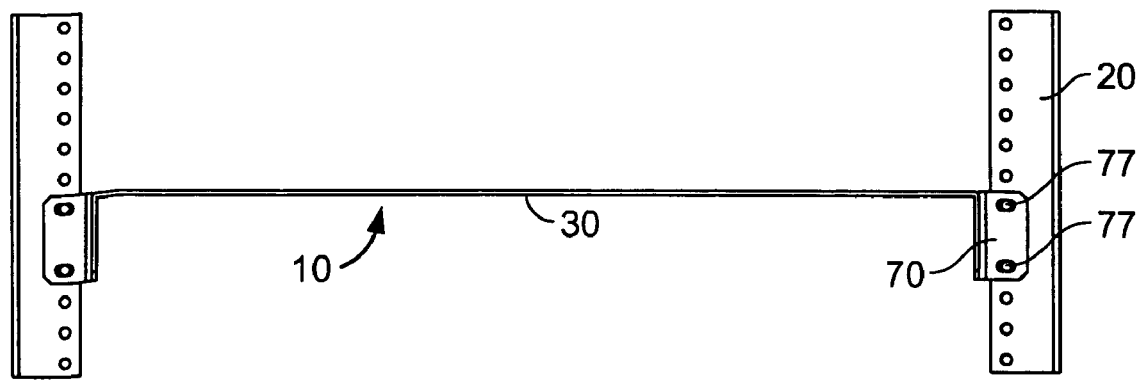
FIG. 9B is a front view of an embodiment of the apparatus of the present invention showing a up-side-down mount.

As illustrated in FIG. 8, the rear sliding bracket 90 includes a rack attach flange 100 and a shelf attach portion 102. The rack attach flange 100 preferably has a plurality of rack mounting holes 105 located in accordance with EIA-310-D. A centrally located adjustment slot 110 is provided on the shelf attach portion 102. The adjustment slot 110 is adapted to receive fasteners such as a shoulder nut 115 therethrough. The shoulder nut may be designed to allow the rear sliding bracket 90 to be adjusted horizontally with respect to the shelf 10, and mates with screws and the like to couple the rear sliding bracket 90 to the desired location on the shelf 10.

Figure 5A:
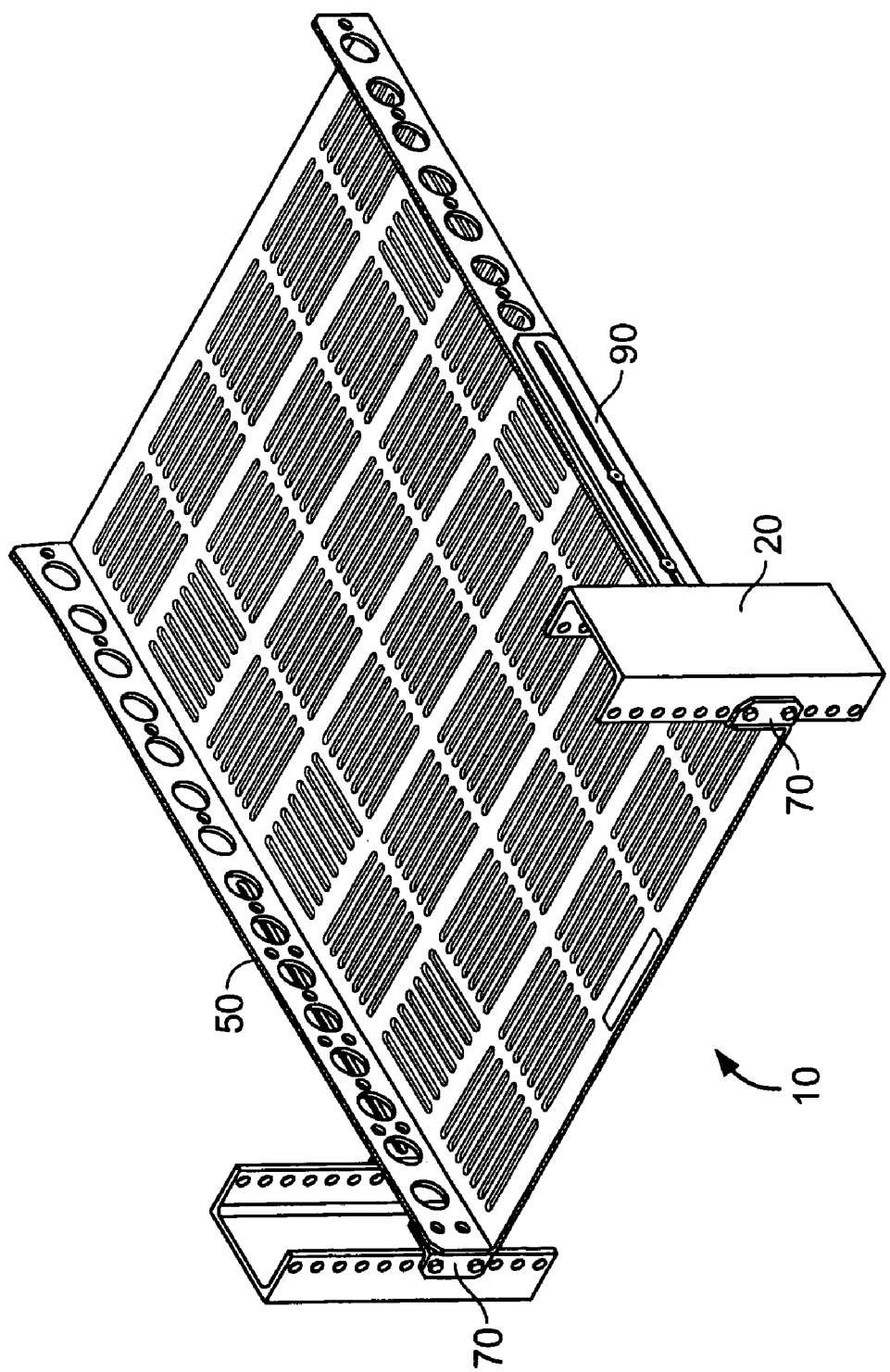
FIG. 5A is a front, angled view of an embodiment of the apparatus of the present invention assembled in a 2-post, flush-mount configuration.
Figure 5B:
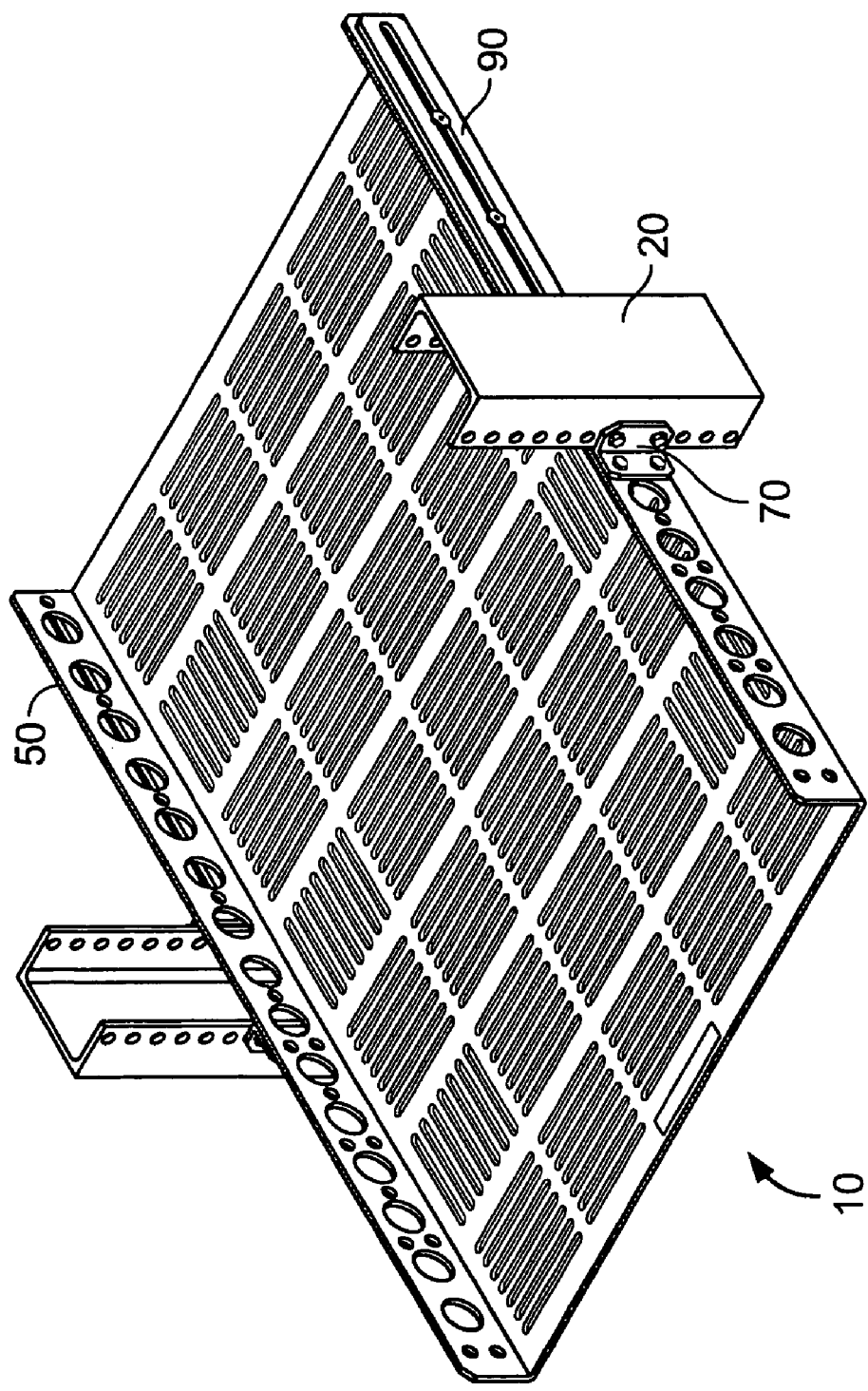
FIG. 5B is a front, angled view of an embodiment of the apparatus of the present invention assembled in a 2-post, center-mount configuration.
Figure 6:
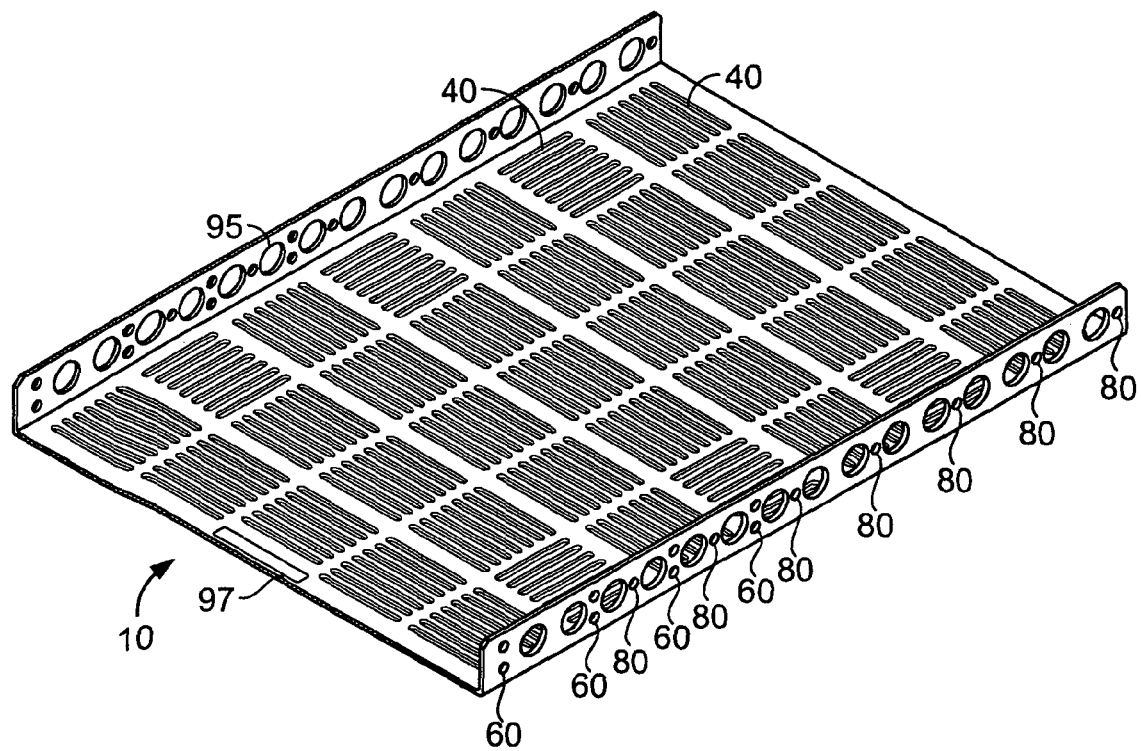
FIG. 6 is a front, angled view of an embodiment of the apparatus of the present invention unassembled.

As can be appreciated from the description herein and from FIGS. 4A, 4B, 5A, 5B, 7 & 8, the mounting locations on the shelf 10 for the front fixed bracket 70 and rear sliding bracket 90 allow coupling of the shelf 10 to a two- or four-post rack 25. In addition and in an exemplary configuration on a two-post rack (FIGS. 5A & 5B), the shelf 10 may be coupled flush to a surface of the posts 20 of the two-post rack system. In an additional exemplary configuration, the shelf 10 may be mounted in a center configuration (FIGS. 2 & 5B). Both exemplary configurations are shown side by side in FIGS. 5A and 5B. It can also be appreciated that the mounting holes of the shelf insure compatibility with substantially all rack hole styles, including, without limitation, round holes, threaded holes and square holes. This may be accomplished through the use of a flange design than may be mounted on the front of the front post and on the back of the back post.

Now referring to FIGS. 9A, 9B, 11A & 11B, the design of the shelf 10 allows for coupling of the shelf 10 to two- or four-post rack systems in a right-side-up (FIGS. 9A & 11A) or up-side-down (FIGS. 9B & 11B) configuration. This allows wide equipment 25 to be mounted on the shelf 10. In an up-side-down configuration, equipment 25 mounted to the shelf 10 may be as wide as the opening in the rack system as set forth in EIA-310-D. In the right-side-up configuration, the two flanges 50 on opposing ends of the base 30 may limit the width of the equipment 25 mounted thereto. Specifically referring to FIG. 11A, which shows the right-side-up orientation, it can be seen this configuration conserves vertical rack space (or in this exemplary case, three units (3U)) while limiting the maximum width of the equipment 25 placed on the shelf 10. FIG. 11B shows a second exemplary configuration of the shelf 10 in an up-side-down orientation, which provides for maximum equipment width while taking up, in this example, 1U of extra space. It can be appreciated that different users will have different needs, and may utilize the present invention in multiple configurations to best meet these needs.

Figure 10A:
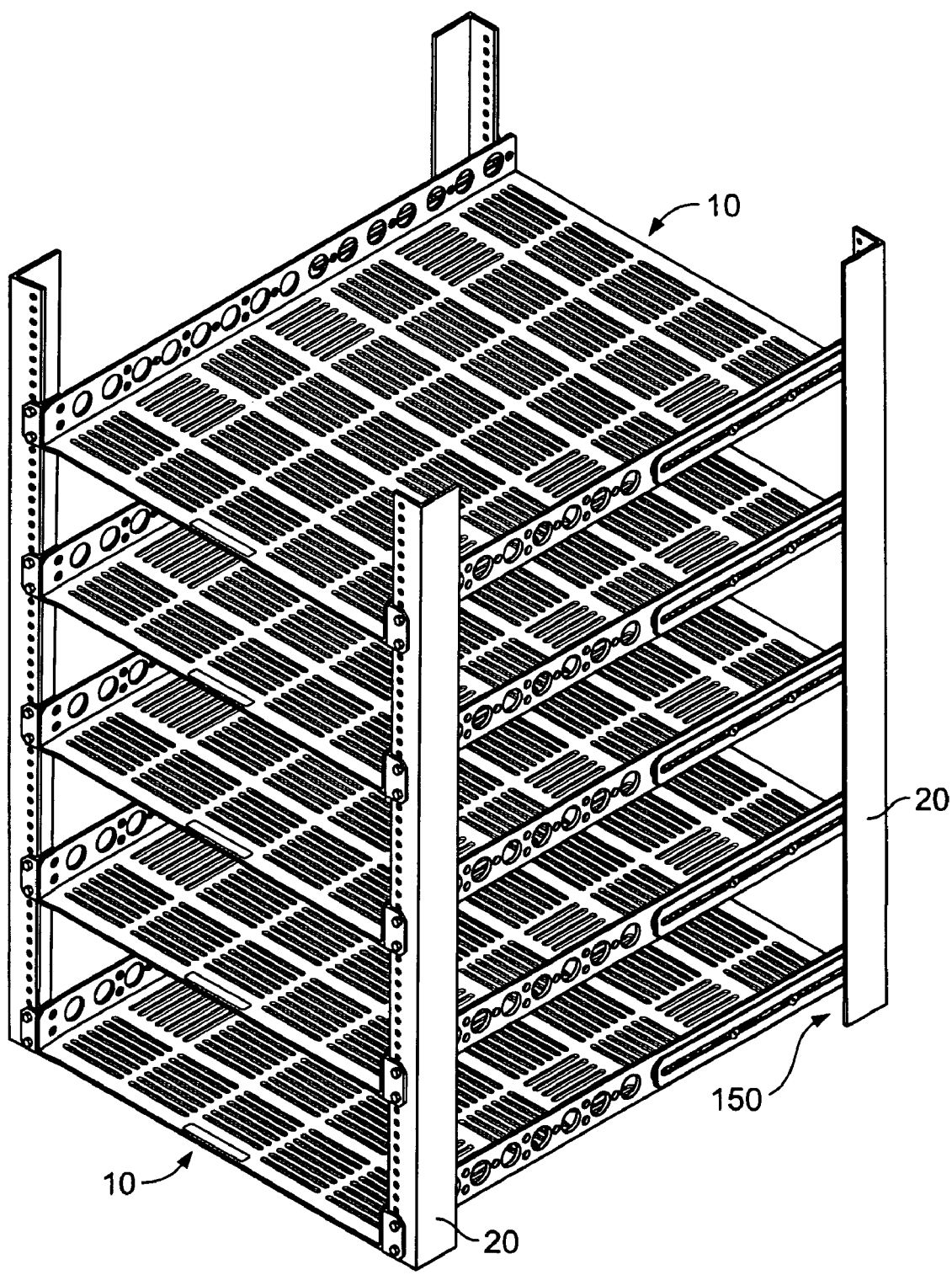
FIG. 10A is front, angled view of a 4-post rack including an exemplary configuration of multiple examples of a 4-post embodiment of the apparatus of the present invention.
Figure 10B:
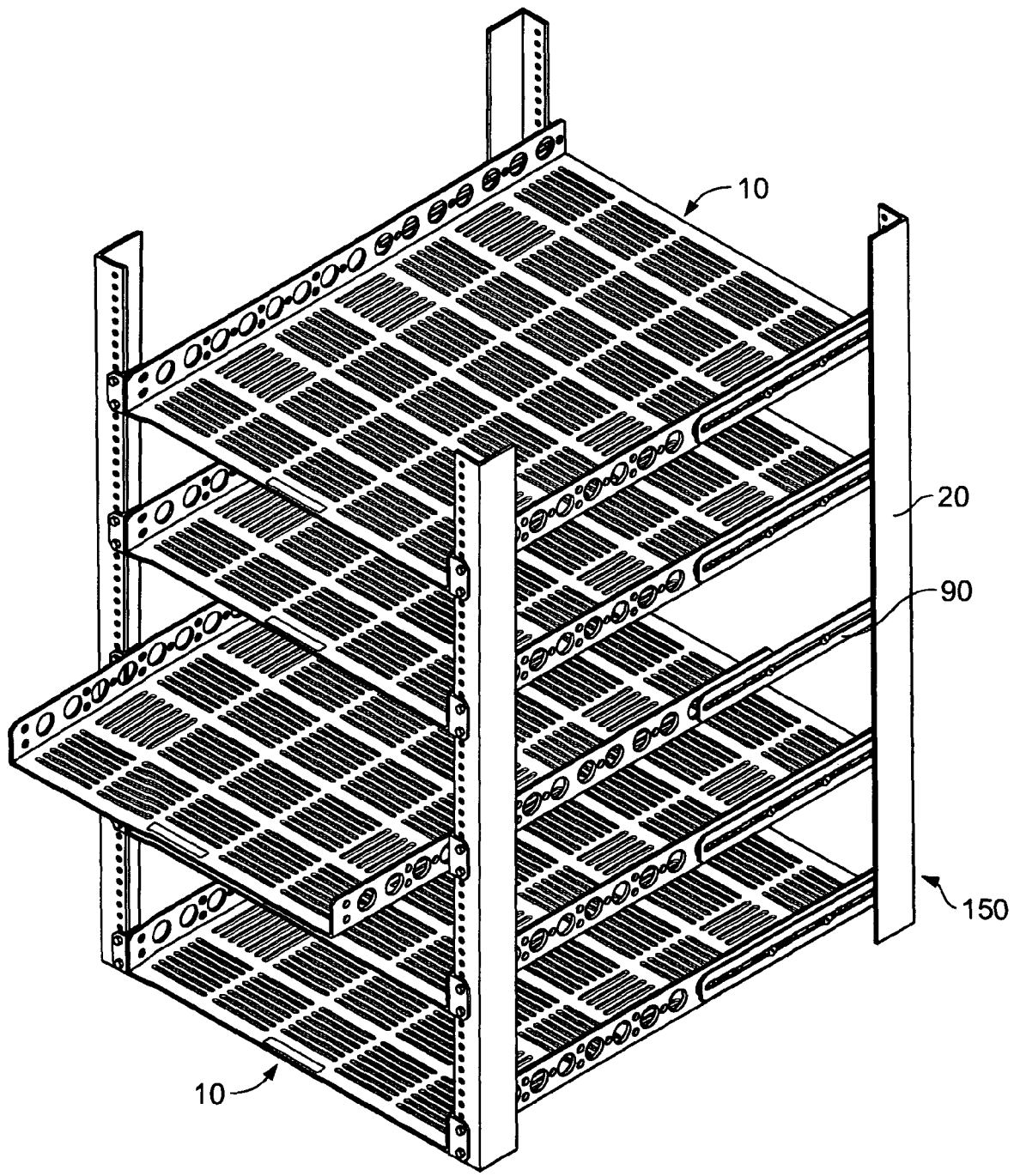
FIG. 10B is a front, angled view of a 4-post rack including an exemplary configuration of multiple examples of a 4-post embodiment of the apparatus of the present invention and illustrating the sliding feature of one shelf.
Figure 10C:
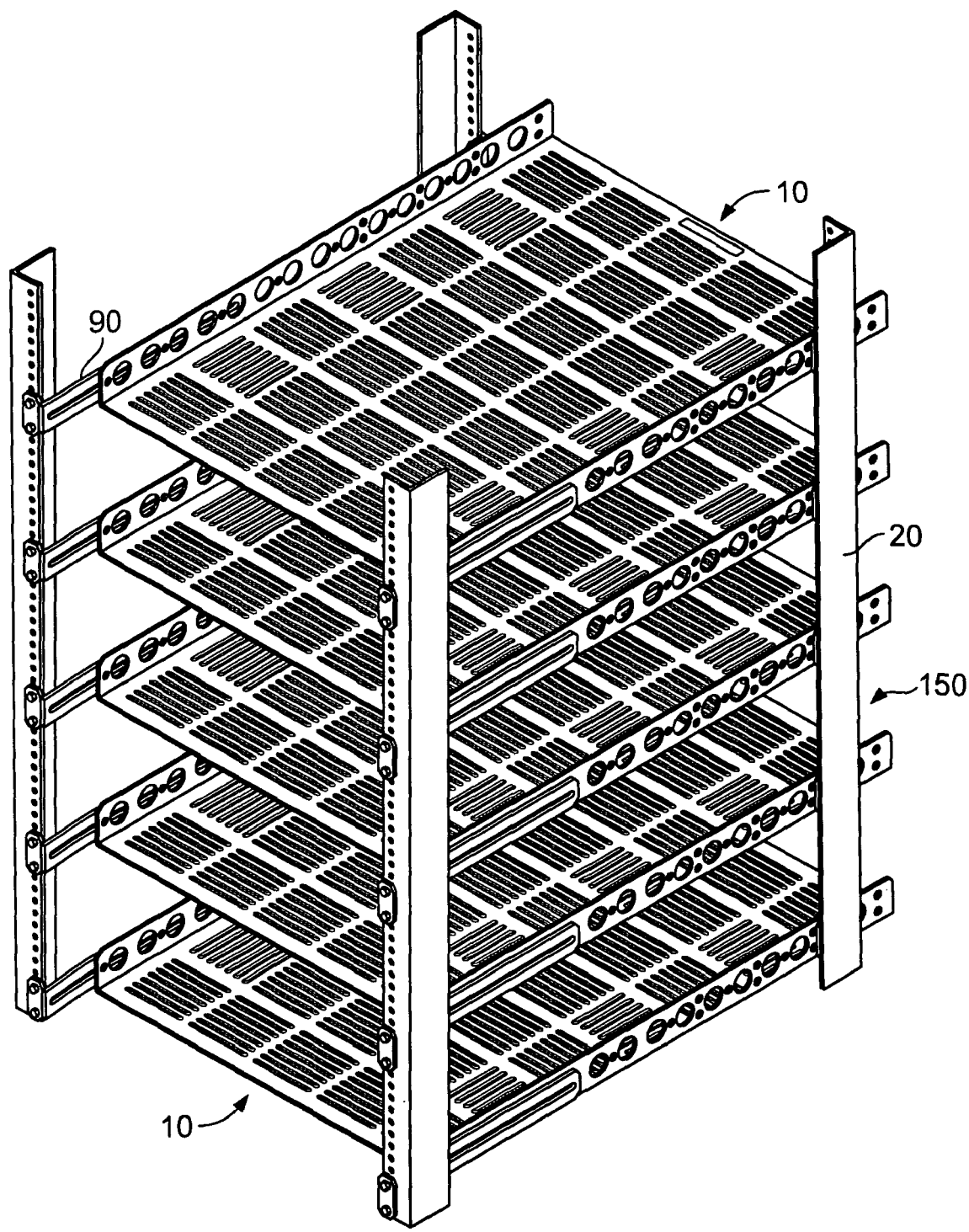
FIG. 10C is a front, angled view of a 4-post rack including an exemplary configuration of multiple examples of a 4-post, deep rack embodiment of the apparatus of the present invention.

FIGS. 10A–10C show different exemplary configurations of the universal rack mountable shelves 10 as coupled to a four-post rack system 150. Referring specifically to FIG. 10A, the fronts of the shelves 10 are coupled to the four-post rack 150 to allow a flush configuration of the shelves 10 with respect to the front posts 20 of the rack system 150. This is an exemplary installation for certain preferred embodiments of the present invention.

FIG. 10B shows a second exemplary configuration of universal rack mountable shelves 10 coupled to a four-post rack 150. In this configuration, one shelf 10 is extended in front of the front rack post 20 via use of the rear sliding bracket 90. It can be appreciated that all shelves 10 may be configured accordingly, if desired. This configuration is especially useful for supporting keyboards and other equipment on the extended shelf 10, or for alternate accessibility to a component on the shelf 10.

FIG. 10C is a third exemplary configuration of universal rack mountable shelves 10 coupled to a four-post rack 150. In this configuration, all shelves 10 are recessed behind the front posts 20 of the four-post rack 150. It can be appreciated that only one or a plurality of shelves 10 may be recessed, if desired. This configuration is especially useful to provide space for patch cables (not shown). This configuration may also be used to provide an alternate means for providing additional space in the front of the rack system 150.

Now referring to FIG. 12, the steps of the method of the present invention in shown. To use the universal rack mountable shelf 10, in Step 10, a two- or four-post rack system is selected. In Step 20, the front fixed bracket 70 and the rear sliding bracket 90 are then coupled to the shelf 10 and the rack system selected in Step 10. A load, such as a computer component or the like, may then be applied in step 30 to the base 30 of the shelf 10 and supported thereon. If enhanced access to the equipment 25 supported on shelf 10 is desired, in Step 40, the shelf 10 may be extended away from its resting position within the rack system selected in Step 10. Once extended, the user has enhanced access to the equipment supported by the shelf 10.

It is to be appreciated that the shelf 10 may couple to substantially any existing two- or four-post rack system and support loads accordingly. It is to be further appreciated that the universal rack mountable shelf 10 of the present invention provides numerous configurations for supporting a variety of loads, depending on the requirements and desires of the user.

A number of embodiments of the invention have been described. Nevertheless, it will be understood that various modifications may be made without departing from the spirit and scope of the invention. Accordingly, other embodiments are within the scope of the following claims.

What is claimed is:

1. A support for supporting a load in a rack system of either a two-post or four-post design, said support comprising:
    a base;
    said base having an upper surface capable of supporting the load and having at least two longitudinal flanges extending along at least a portion of a longitudinal dimension of the base; and
    at least one means, for each longitudinal flange, for securely attaching the base to the rack system, the means for securely attaching adapted to enable attaching the base to rack systems having at least two different designs, wherein each different design is associated with at least one different location along the longitudinal dimension of the base for attaching the base using the longitudinal flange, and wherein at least one of the means for securely attaching the base to the rack system comprises a bracket adapted to attach to at least one of the longitudinal flanges at one or more fixed locations, and wherein the bracket comprises:
    a first flange adapted to attach to at least one of the longitudinal flanges of the base; and
    a second flange adapted to attach to a post of the rack system.

2. The support of claim 1, wherein the upper surface of the base is adapted to support electrical equipment selected from the group consisting of: computers, electrical components, servers, hubs, and switches.

3. The support of claim 1, wherein the upper surface includes means for increasing horizontal friction produced between the upper surface and the equipment thereon.

4. The support of claim 3, wherein the means for increasing horizontal friction comprises at least one means for increasing horizontal friction selected from the group consisting of: a material associated with the upper surface, one or more openings within the upper surface, and a roughened layer of the upper surface.

5. The support of claim 1, wherein:
    each longitudinal flange includes at least one hole at each of a plurality of locations along the longitudinal dimension of the base, with each location corresponding to one of the fixed locations;
    the first flange includes at least one hole adapted to mate with at least one of the holes at any one of the plurality of locations along the longitudinal dimension of the base; and
    the second flange includes at least one hole adapted to mate with at least one hole on the post of the rack system.

6. The support of claim 1, wherein at least one of the means for securely attaching the base to the rack system comprises a bracket adapted to slidably engage at least one of the longitudinal flanges.

7. The support of claim 6, wherein the bracket comprises:
    a flange adapted to attach to a post of the rack system; and
    a portion adapted to slidably engage at least one of the longitudinal flanges.

8. The support of claim 7, wherein:
    the portion adapted to slidably engage at least one of the longitudinal flanges defines an adjustment slot adapted to receive a fastener for mating with at least one hole in at least one of the longitudinal flanges; and
    the flange includes at least one hole adapted to mate with at least one of the holes on the post of the rack system.

9. The support of claim 1, wherein at least one of the means for securely attaching the base to the rack system is adapted to securely attach the base to the rack system in an inverted position, the base having a lower surface capable of supporting a load when the base is inverted, wherein attaching the base in the inverted position is adapted to enable accommodating loads having at least one dimension that cannot be accommodated when the base is in an upright position.

10. The support of claim 1, wherein at least one of the different locations of each different design relates to at least two different designs selected from the group consisting of:

a two-post design including a first location along the longitudinal dimension of the base for a first attachment of the base to the rack system;

a two-post design including a second location along the longitudinal dimension of the base for the first attachment, wherein the second location differs from the first location;

a two-post design including a third location along the longitudinal dimension of the base for a second attachment of the base to the rack system, wherein the second attachment differs from the first attachment;

a two-post design including a fourth location along the longitudinal dimension of the base for the second attachment, wherein the fourth location differs from the third location;

a four-post design having a first horizontal dimension along the longitudinal dimension of the base between attachments of the base to the rack system; and a four-post design having a second horizontal dimension along the longitudinal dimension of the base between attachments of the base to the rack system, wherein the second horizontal dimension differs from the first horizontal dimension.

11. The support of claim 1, wherein two longitudinal flanges are disposed on different lateral sides of the upper surface of the base.

12. A support for supporting a load in a rack system of either a two-post or four-post design, said support comprising:

a base;

said base having an upper surface capable of supporting the load and having at least two longitudinal flanges extending along at least a portion of a longitudinal dimension of the base; and at least one means, for each longitudinal flange, for securely attaching the base to the rack system, the means for securely attaching adapted to enable attaching the base to rack systems having at least two different designs, wherein each different design is associated with at least one different location along the longitudinal dimension of the base for attaching the base using the longitudinal flange, wherein at least one of the means for securely attaching the base to the rack system comprises:

a first bracket adapted to attach to a at least one of the longitudinal flanges at one or more fixed locations along the longitudinal dimension of the base; and a second bracket adapted to slidably engaging at least one of the longitudinal flanges.

13. The support of claim 12, wherein:

the first bracket comprises a first flange adapted to attach to a at least one of the longitudinal flanges of the base and a second flange adapted to attach to at least one post of the rack system; and the second bracket comprises a third flange adapted to attach to at least one of the posts of the rack system and a portion adapted to slidably engage at least one of the longitudinal flanges to adjustably attach along the longitudinal dimension of the base.

14. The support of claim 13, wherein:

each longitudinal flange includes at least one hole at each of a plurality of locations along the longitudinal dimension of the base, with each location corresponding to one of the fixed locations along the longitudinal dimension of the base;

the first flange includes at least one hole adapted to mate with at least one of the holes at any one of the plurality of locations along the longitudinal dimension of the base;

the second flange includes at least one hole adapted to mate with at least one hole on at least one of the posts of the rack system;

the portion adapted to slidably engage at least one of the longitudinal flanges defines an adjustment slot adapted to receive a fastener for mating with at least one of the holes in at least one of the longitudinal flanges along the longitudinal dimension of the base; and the third flange includes at least one hole adapted to mate with at least one of the holes on at least one of the posts of the rack system.

15. The support of claim 12, wherein:

the first bracket and the second bracket enable attaching the base to a rack system having a two-post design by positioning the first bracket and the second bracket to enable attaching the first bracket to a first lateral side of a post on the rack system and attaching the second bracket to a second lateral side of the post; and the first bracket and the second bracket alternatively enable attaching the base to a rack system having a four-post design by positioning the first bracket and the second bracket to enable attaching the first bracket to a first post on the rack system and attaching the second bracket to a second post on the rack system.

16. The support of claim 12, wherein the portion adapted to slidably engage a longitudinal flange to adjustably attach along the longitudinal dimension of the base enables attaching the base to rack systems having a four-post design and having any one of a plurality of different horizontal dimensions along the longitudinal dimension of the base.

17. The support of claim 12, wherein:

the first bracket and the second bracket enable attaching the base to a rack system having a two-post design by positioning the first bracket and the second bracket to enable attaching the first bracket to a first lateral side of a post on the rack system and attaching the second bracket to a second lateral side of the post such that the base has a first horizontal position relative to the post; and the first bracket and the second bracket alternatively enable attaching the base to a rack system having a two-post design by positioning the first bracket and the second bracket to enable attaching the first bracket to a first lateral side of a post on the rack system and attaching the second bracket to a second lateral side of the post such that the base has a second horizontal position relative to the post, the second horizontal position different than the first horizontal position.

18. The support of claim 12, wherein the upper surface includes means for increasing horizontal friction produced between the upper surface and the load equipment thereon.

19. A support for supporting a load in a rack system of either a two-post or four-post design, said support comprising:

a base;

said base having an upper surface capable of supporting the load and having at least two longitudinal flanges extending along at least a portion of a longitudinal dimension of the base; and at least one means for each longitudinal flange, for securely attaching the base to the rack system, the means for securely attaching adapted to enable attaching the base to rack systems having at least two different designs, wherein each different design is associated with at least one different location along the longitudinal dimension of the base for attaching the base using the longitudinal flange, wherein at least one of the means for securely attaching the base to the rack system comprises:
- a first bracket adapted to attach to at least one of the longitudinal flanges at one or more first locations along the longitudinal dimension of the base; and
- a second bracket adapted to attach to at least one of the longitudinal flanges at one of or more second locations along the longitudinal dimension of the base, wherein at least one of the first bracket or the second bracket is adapted to attach to at least one of the longitudinal flanges in at least two alternative positions, with each alternative position enabling the base to be attached to a rack system having at least one of a different design or a different dimension.

20. The support of claim 19, wherein the upper surface includes means for increasing horizontal friction produced between the upper surface and the load equipment thereon.

21. A support for supporting a load in a rack system of either a two-post or four-post design, said support comprising:
- a base;
- said base having an upper surface capable of supporting the load and having at least two longitudinal flanges extending along at least a portion of a longitudinal dimension of the base; and
- at least one means, for each longitudinal flange, for securely attaching the base to the rack system, the means for securely attaching adapted to enable attaching the base to rack systems having at least two different designs, wherein each different design is associated with at least one different location along the longitudinal dimension of the base for attaching the base using the longitudinal flange, wherein at least one of the means for securely attaching the base to the rack system defines one or more fixed locations along the longitudinal dimension of the base for attaching a first bracket to the longitudinal flange, and wherein at least one of the means for securely attaching the base to the rack system is adapted to slidably engage a second bracket to adjustably attach the longitudinal flange and the second bracket along the longitudinal dimension of the base.

22. The support of claim 21, wherein at least one of the means for securely attaching the base to the rack system comprises:
- at least one hole at each of a plurality of locations along the longitudinal dimension of the base adapted for attaching the first bracket, with each location corresponding to one of the fixed locations; and
- at least one hole along the longitudinal dimension of the base comprising an adjustment slot adapted to enable slidably engaging an adjustment slot in the second bracket using a fastener.

23. The support of claim 21, wherein the upper surface includes means for increasing horizontal friction produced between the upper surface and the load equipment thereon.

* * * * *

UNITED STATES PATENT AND TRADEMARK OFFICE
CERTIFICATE OF CORRECTION

| | | |
|---|---|---|
| PATENT NO. | : 7,134,558 B1 | Page 1 of 1 |
| APPLICATION NO. | : 10/389661 | |
| DATED | : November 14, 2006 | |
| INVENTOR(S) | : Robert H. Mimlitch, III and David A. Norman | |

It is certified that error appears in the above-identified patent and that said Letters Patent is hereby corrected as shown below:

In column 7, claim 12, line 46 – delete the second "a"

In column 7, claim 13, line 53 – delete "a"

In column 8, claim 19, line 64 – after "means" insert -- , --

In column 9, claim 19, line 11 – delete "of"

Signed and Sealed this

Seventeenth Day of April, 2007

JON W. DUDAS
*Director of the United States Patent and Trademark Office*